(12) United States Patent
Akerib et al.

(10) Patent No.: US 12,008,068 B2
(45) Date of Patent: *Jun. 11, 2024

(54) IN MEMORY MATRIX MULTIPLICATION AND ITS USAGE IN NEURAL NETWORKS

(71) Applicant: GSI Technology Inc., Sunnyvale, CA (US)

(72) Inventors: Avidan Akerib, Tel Aviv (IL); Pat Lasserre, San Jose, CA (US)

(73) Assignee: GSI Technology Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/354,679

(22) Filed: Jul. 19, 2023

(65) Prior Publication Data

US 2023/0359698 A1 Nov. 9, 2023

Related U.S. Application Data

(60) Continuation of application No. 17/194,264, filed on Mar. 7, 2021, now Pat. No. 11,734,385, which is a
(Continued)

(51) Int. Cl.
*G06F 17/16* (2006.01)
*G06F 3/06* (2006.01)
(Continued)

(52) U.S. Cl.
CPC ............ *G06F 17/16* (2013.01); *G06F 3/0604* (2013.01); *G06F 3/0644* (2013.01);
(Continued)

(58) Field of Classification Search
CPC .... G06F 3/0604; G06F 3/0644; G06F 3/0659; G06F 3/067; G06F 17/16; G11C 7/00;
(Continued)

(56) References Cited

U.S. PATENT DOCUMENTS 5,087,826 A 2/1992 Holler
5,317,573 A 5/1994 Bula
(Continued)

FOREIGN PATENT DOCUMENTS

CN 1774709 A 5/2006
KR 1020030072860 A 9/2003
(Continued)

OTHER PUBLICATIONS

English Machine Translation of Korean Publication 10-2003-0072860 downloaded from the KIPO Website.
(Continued)

*Primary Examiner* — Emily E Larocque
(74) *Attorney, Agent, or Firm* — HEIDI BRUN ASSOCIATES LTD.

(57) ABSTRACT

A device for in memory vector-matrix multiplication includes a memory array and in-memory logic. The memory array has at least two sections and stores a multiplier matrix. The memory array also receives and stores an input multiplicand arranged in a vector such that the operands of the vector-matrix multiplication are located on a same column of the memory array. Each of the sections is one of: a volatile memory array, a non-volatile memory array, a destructive memory array and a non-destructive memory array. The in-memory logic computes an output of the vector-matrix multiplication using the stored input vector and the stored multiplier matrix. The memory array is one of the following type of memory array: RAM, DRAM, SRAM, Re-RAM, ZRAM, MRAM and Memristor.

4 Claims, 14 Drawing Sheets

Related U.S. Application Data division of application No. 15/466,889, filed on Mar. 23, 2017, now Pat. No. 10,997,275.

(60) Provisional application No. 62/312,162, filed on Mar. 23, 2016.

(51) Int. Cl.
| | | |
|---|---|---|
| *G06N 3/04* | (2023.01) | |
| *G06N 3/063* | (2023.01) | |
| *G06N 3/08* | (2023.01) | |
| *G11C 7/10* | (2006.01) | |
| *G11C 7/22* | (2006.01) | |
| *G11C 8/10* | (2006.01) | |
| *G11C 15/00* | (2006.01) | |

(52) U.S. Cl.
CPC ............ *G06F 3/0659* (2013.01); *G06F 3/067* (2013.01); *G06N 3/04* (2013.01); *G06N 3/08* (2013.01); *G11C 7/22* (2013.01); *G11C 15/00* (2013.01); *G06N 3/063* (2013.01); *G11C 7/1006* (2013.01); *G11C 8/10* (2013.01)

(58) Field of Classification Search
CPC .... G11C 7/10; G11C 7/22; G11C 7/18; G11C 7/1006; G11C 15/00–046; G06N 3/04–049; G06N 3/063; G06N 3/0635; G06N 3/08
See application file for complete search history.

(56) References Cited

U.S. PATENT DOCUMENTS

| | | |
|---|---|---|
| 5,784,309 A | 7/1998 | Budil |
| 9,558,812 B2 | 1/2017 | Akerib |
| 10,997,275 B2 | 5/2021 | Akerib |
| 11,734,385 B2 | 8/2023 | Akerib |
| 2005/0125477 A1 | 6/2005 | Genov |
| 2005/0193050 A1 | 9/2005 | Sazegari |
| 2007/0186036 A1 | 8/2007 | Bittner |
| 2009/0303767 A1 | 12/2009 | Akerib |
| 2010/0122070 A1 | 5/2010 | Guevorkian |
| 2014/0075135 A1 | 3/2014 | Choi |
| 2014/0172937 A1 | 6/2014 | Linderman |
| 2016/0224466 A1 | 8/2016 | Morad |
| 2019/0237137 A1 | 8/2019 | Buchanan |

FOREIGN PATENT DOCUMENTS

| | | |
|---|---|---|
| KR | 1020140033937 A | 3/2014 |
| WO | 2017068443 A1 | 4/2017 |

OTHER PUBLICATIONS

Merriam-Webster online dictionary, definitions of simultaneous and concurrent, at http://www.merriam-webster.com/dictionary, downloaded Aug. 21, 2020.

English Abstract of CN1774709 downloaded from Google Patents on May 8, 2022.

| | C0 | C1 | C2 | | Cn |
|---|---|---|---|---|---|
| R-vector-bit-0 | $i_0$ | $i_0$ | $i_0$ | | $i_0$ |
| R-matrix-row-0 | $H_{00}$ | $H_{01}$ | $H_{02}$ | | $H_{0n}$ |
| R-Product-0 | $i_0 \times H_{00}$ | $i_0 \times H_{01}$ | $i_0 \times H_{02}$ | | $i_0 \times H_{0n}$ |
| R-vector-bit-1 | $i_1$ | $i_1$ | $i_1$ | | $i_1$ |
| R-matrix-row-1 | $H_{10}$ | $H_{11}$ | $H_{12}$ | | $H_{1n}$ |
| R-Product-1 | $i_1 \times H_{10}$ | $i_1 \times H_{11}$ | $i_1 \times H_{12}$ | | $i_1 \times H_{1n}$ |
| | | | | | |
| | | | | | |
| | | | | | |
| R-vector-bit-m | $i_0$ | $i_1$ | $i_2$ | | $i_n$ |
| R-matrix-row-m | $H_{m0}$ | $H_{m1}$ | $H_{m2}$ | | $H_{mn}$ |
| R-Product-m | $i_0 \times H_{m0}$ | $i_1 \times H_{m1}$ | $i_2 \times H_{m2}$ | | $i_n \times H_{mn}$ |
| R-SUM | $z_0$ | $z_1$ | $z_2$ | | $z_n$ |

FIG. 5

|  | C0 | C1 | C2 |
|---|---|---|---|
| R-vector-bit-0 | $i_0$ | $i_0$ | $i_0$ |
| R-matrix-row-0 | $H_{00}$ | $H_{01}$ | $H_{02}$ |
| R-Product-0 | $i_0 \times H_{00}$ | $i_0 \times H_{01}$ | $i_0 \times H_{02}$ |
| R-vector-bit-1 | $i_1$ | $i_1$ | $i_1$ |
| R-matrix-row-1 | $H_{10}$ | $H_{11}$ | $H_{12}$ |
| R-Product-1 | $i_1 \times H_{10}$ | $i_1 \times H_{11}$ | $i_1 \times H_{12}$ |
| R-vector-bit-2 | $i_2$ | $i_2$ | $i_2$ |
| R-matrix-row-2 | $H_{20}$ | $H_{21}$ | $H_{22}$ |
| R-Product-2 | $i_2 \times H_{20}$ | $i_2 \times H_{21}$ | $i_2 \times H_{22}$ |
| R-SUM | $i_0 \times H_{00} +$ $i_1 \times H_{10} +$ $i_2 \times H_{20} =$ $z_0$ | $i_0 \times H_{01} +$ $i_1 \times H_{11} +$ $i_2 \times H_{21} =$ $z_1$ | $i_0 \times H_{02} +$ $i_1 \times H_{12} +$ $i_2 \times H_{22} =$ $z_2$ |

— 315

SUM → R-SUM

FIG. 6D

|   | C0 | C1 | C2 — 315 |
|---|---|---|---|
| R-vector-bit-0 | $i_0$ | $i_0$ | $i_0$ |
| R-vector-bit-1 | $i_1$ | $i_1$ | $i_1$ |
| R-vector-bit-2 | $i_2$ | $i_2$ | $i_2$ |
| R-matrix-row-0 | $H_{00}$ | $H_{01}$ | $H_{02}$ |
| R-matrix-row-1 | $H_{10}$ | $H_{11}$ | $H_{12}$ |
| R-matrix-row-2 | $H_{20}$ | $H_{21}$ | $H_{22}$ |
| R-Product-0 | $i_0 \times H_{00}$ | $i_0 \times H_{01}$ | $i_0 \times H_{02}$ |
| R-Product-1 | $i_1 \times H_{10}$ | $i_1 \times H_{11}$ | $i_1 \times H_{12}$ |
| R-Product-2 | $i_2 \times H_{20}$ | $i_2 \times H_{21}$ | $i_2 \times H_{22}$ |
| R-SUM | $z_0$ | $z_1$ | $z_2$ |

FIG. 7

IN MEMORY MATRIX MULTIPLICATION AND ITS USAGE IN NEURAL NETWORKS

CROSS REFERENCE TO RELATED APPLICATIONS

This application is a continuation application of U.S. Ser. No. 17/194,264, filed Mar. 7, 2021, which is a divisional application of U.S. patent application Ser. No. 15/466,889, filed Mar. 23, 2017, which claims priority from U.S. provisional patent application 62/312,162 dated Mar. 23, 2016, all of which are incorporated herein by reference.

FIELD OF THE INVENTION

The present invention relates to memory devices generally and to matrix multiplication in associative memory devices in particular.

BACKGROUND OF THE INVENTION

Matrix multiplication is a common task performed in computational procedures and algorithms in numerous fields, such as graph theory, graphics, artificial intelligence, data mining, big data computing, prediction analysis, deep learning, neural networks and the like. The matrix multiplication procedure is a complex procedure and consumes a lot of computational resources.

An artificial neural network is a computation paradigm inspired by the way a brain processes information, aimed at solving problems in the same way that the human brain would. The brain is composed of a large number of cells highly interconnected to each other. Information in the brain is relayed between cells using signals (chemical or electrical) that pass through specialized structures between cells, that enable the signal to be relayed between the cells, called synapses.

The artificial neural network is mathematically modeled and used to provide output according to specific input, imitating the flow in the brain. The mathematical model of an artificial neural network includes multiple nodes (representing the cells of the brain) connected by multiple weighted links (representing the synapses connecting the cells of the brain). The nodes and links are mathematically represented by matrices and vectors and activating an artificial neural network requires significant matrix operations.

If A is an n×m multiplicand matrix and B is an m×p multiplier matrix, their product matrix AB is an n×p output matrix, in which the m entries of a row of A are multiplied with the m entries of a column of B and summed to produce an entry of AB as described in equation 1:

$$(AB)_{ij} = \sum_{k=1}^{m}(A_{ik}B_{kj}) \qquad \text{Equation 1}$$

It may be worth noting that, in order to perform matrix multiplication, the number of columns m in the multiplicand matrix must be equal to the number of rows m of the multiplier matrix.

A vector is a special type of matrix having only one row, i.e. the vector can be perceived as n×m matrix where n=1. The multiplication of a vector and a matrix, naturally, uses the same formula described in equation 1 hereinabove. When the multiplicand is a 1×p vector and the multiplier is a p×m matrix, the result of a multiplication is a 1×m vector.

The naïve complexity of a general matrix multiplication is O(mpn). When both the multiplicand and multiplier matrices are square matrices (n×n) the computation complexity may be $O(n^3)$ and when the multiplicand is a vector (1×m) and the multiplier is a matrix (m×n), the complexity of the computation may be O(mn).

FIG. 1, to which reference is now made, illustrates an example of a multiplicand vector i (1×3), a multiplier matrix H (3×3) and a result vector z (1×3). Multiplicand vector i has three columns C0, C1 and C2, storing values $i_0$, $i_1$ and $i_2$, respectively. Multiplier matrix H has three columns C0, C1 and C2 and three rows R0, R1 and R2. The values stored in matrix H are each labeled with a two digit subscript, j and k, where j stands for the row and k stands for the column. For example, value $H_{21}$, is stored in row R2 and column C1. Vector z stores the results of the multiplication $z_0$, $z_1$ and $z_2$. In the figure, each bit of vector i, has a different pattern, each row of matrix H has a different shade of gray and bits of vector z, has no shade and no pattern.

The multiplication result, vector z, is computed according to equation 1. As a vector has only one row, the subscript notation may omit the row number (instead of using $i_{00}$ the notation will be $i_0$), and the expansion of equation 1 for this specific example may be presented as the following three equations: equation 1-0, equation 1-1 and equation 1-2

$$z_0 = i_0 \times H_{00} + i_1 \times H_{10} + i_2 \times H_{20} \qquad \text{Equation 1-0}$$

$$z_1 = i_0 \times H_{01} + i_1 \times H_{11} + i_2 \times H_{21} \qquad \text{Equation 1-1}$$

$$z_2 = i_0 \times H_{02} + i_1 \times H_{12} + i_2 \times H_{22} \qquad \text{Equation 1-2}$$

A visual representation of the multiplications needed during a vector-matrix multiplication is illustrated in FIG. 2, to which reference is now made. Each operand (bit) from the multiplicand vector i needs to be multiplied by an entire row of matrix H, (i.e. by each operand (bit) from the row). Note that the sum operation between all the multiplication results is not illustrated in FIG. 2. The multiplication between operands is visualized by a connecting line and it may be appreciated that the number of connections between operands is m×n, and in the example, the number of connections is 3×3=9.

Matrix multiplication may be regarded as repeating the vector multiplication several times, once for each row of the multiplicand matrix.

SUMMARY OF THE PRESENT INVENTION

There is also provided, in accordance with a preferred embodiment of the present invention, a method for in memory vector-matrix multiplication. The method includes having a multiplier matrix stored in a memory array having at least two sections, wherein each of the sections is one of: a volatile memory array, a non-volatile memory array, a destructive memory array and a non-destructive memory array. The method also includes receiving an input multiplicand arranged in a vector, storing it in the memory array such that the operands of the vector-matrix multiplication are located on a same column of the memory array, and in-memory, computing the vector-matrix multiplication using the stored input vector and the stored multiplier matrix.

There is also provided, in accordance with a preferred embodiment of the present invention, a device for in memory vector-matrix multiplication. The device includes a memory array and in-memory logic. The memory array has at least two sections and stores a multiplier matrix. The memory array also receives and stores an input multiplicand arranged in a vector such that the operands of the vector-matrix multiplication are located on a same column of the memory array. Each of the sections is one of: a volatile memory array, a non-volatile memory array, a destructive memory array and a non-destructive memory array. The in-memory logic computes an output of the vector-matrix multiplication using the stored input vector and the stored multiplier matrix.

Moreover, in accordance with a preferred embodiment of the present invention, the memory array is one of the following type of memory array: RAM, DRAM, SRAM, Re-RAM, ZRAM, MRAM and Memristor.

Finally, in accordance with a preferred embodiment of the present invention, the multiplier matrix comprises weights of a neural network and wherein the input multiplicand is an input of the neural network.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 is a schematic illustration of the placement in memory of the different participants in the vector matrix multiplication process, useful in understanding the operation of the device of FIG. 3;

FIGS. 6A, 6B, 6C and 6D are detailed schematic illustrations of the value of cells in a section of the associative memory array, one figure for each of type of storage in a row, useful in understanding the source of the data described in FIG. 5;

FIG. 7 is a schematic illustration of an alternative embodiment for row assignments in a single segment of the associative memory array;

Figure 1:
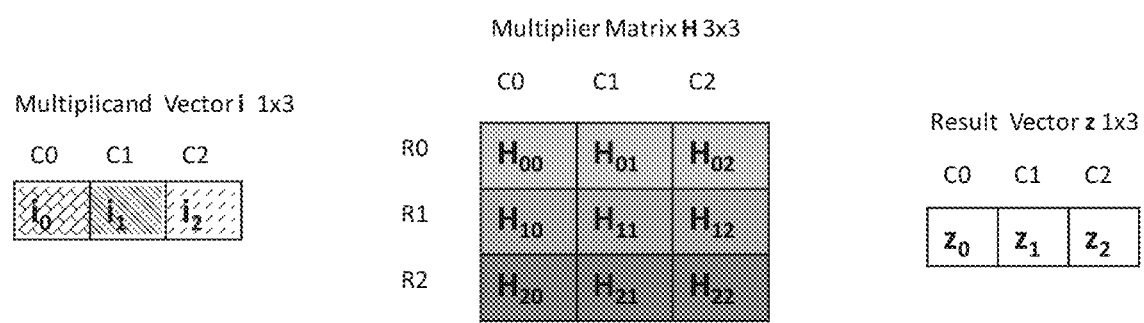
FIG. 1 is a schematic illustration of a multiplicand vector, a multiplier matrix and a result vector.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that matrix multiplication may be performed more efficiently in memory using associative memory devices, such as those described in U.S. Pat. No. 8,238,173, filed on Jul. 16, 2009, and U.S. Pat. No. 9,558,812, filed on May 5, 2016, both assigned to the common assignee of the present invention, and incorporated herein by reference.

As discussed in the above mentioned patents, multiple rows may be accessed in each computation cycle, resulting in the ability to perform multiple cell operations, such as a multi-cell write operation and a multi-cell computation.

Figure 3:
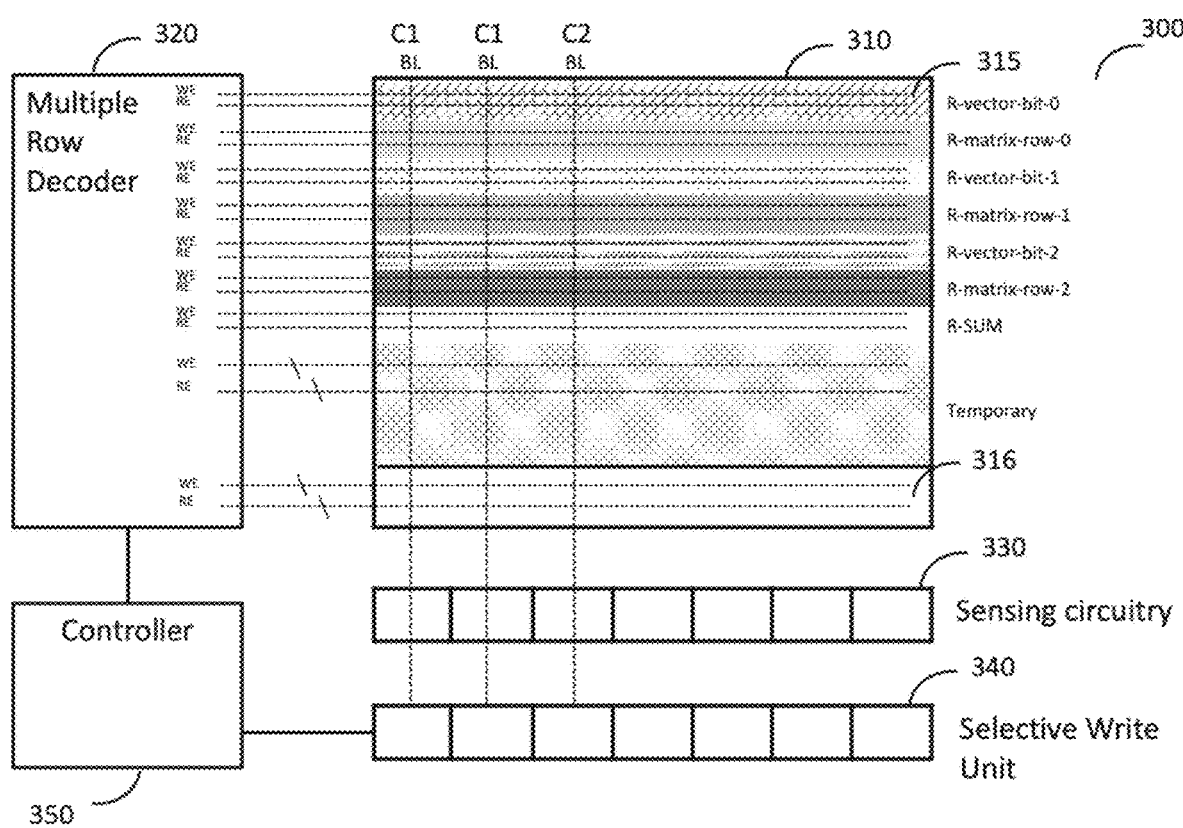
FIG. 3 is a schematic illustration of an associative memory device, constructed and operative in accordance with a preferred embodiment of the present invention.

FIG. 3, to which reference is now made, illustrates an associative memory device 300 constructed and operative in accordance with a preferred embodiment of the present invention. Associative memory device 300 may comprise a memory array 310, a multiple row decoder 320, sensing circuitry 330, a selective write unit 340 and a controller 350.

Memory array 310 may be any suitable memory array, volatile or non-volatile, destructive or non-destructive such as RAM, DRAM, SRAM, Re-RAM, ZRAM, MRAM, Memristor and the like, and may comprise pure memory cells, designed to store data only with no additional circuitry. In accordance with a preferred embodiment of the present invention, memory array 310 may be a single memory array or may be divided into two or more sections, each of which comprises multiple cells arranged in rows and columns in which the data may be stored. For the examples of FIG. 3, memory array 310 is assumed to be divided into two sections: section 315 and, section 316. Data from different sources is stored in rows of section 315 in a unique manner. Rows, labeled as R-vector-bit, may store data from a vector, rows, labeled as R-matrix-row, may store data from a matrix, rows labeled as R-SUM may store a sum, calculated in memory, and rows labeled as Temporary may store intermediate values calculated in memory that may be needed for other calculations. As an example, section 315 includes 3 rows of type R-vector-bit (R-vector-bit-0, R-vector-bit-1 and R-vector-bit-2), 3 rows of type R-matrix-row (R-matrix-row-0, R-matrix-row-1 and R-matrix-row-2) 1 row of type R-SUM and a plurality of rows of type Temporary. It may be appreciated that the number of rows and columns in the illustration is merely an example for the illustration and the number of rows and columns in section 315 may be completely different. The allocation of rows in section 316 is not specified.

Multiple row decoder 320 may be any suitable row decoder capable of concurrently activating a plurality of rows. Row decoder 320 may activate two or more rows of memory array 310 at a time. All columns of memory array 310 may be activated at the same time, providing concurrent computation on all columns of memory array 310 when a read operation is performed, and providing a concurrent write operation when a write operation is performed.

Sensing circuitry 330 may be formed of any suitable sensing circuitry and may be capable of sensing the value on any bit-line connecting cells of a column and may provide the result of a Boolean function performed between selected cells of each column.

Selective write unit 340 may select which sensed columns to write back to memory array 310 and is capable of writing the value from a plurality of sensing circuitry components concurrently.

Controller 350 may indicate to multiple row decoder 320 which rows to activate for the current operation, read or write, and may also indicate to selective write unit 340 from which columns to write the output of sensing circuitry 330 back into memory array 310. The rows to which the data may be written in a selective write operation may be in the same section as the previously selected rows or in a different section.

It may be appreciated that the computations occur within the memory array, as a result of the multi read operation. Thus, associative memory device 300 may implement concurrently any Boolean operation, on all the columns of memory array 310, resulting in a massive, in place, parallel computation.

Applicant has realized that storing the vector and the matrix data in specific locations in memory array 310 may have a profound implication on the complexity of the vector-matrix computation. As described hereinbelow, the computation complexity of a vector-matrix multiplication, in the present invention, may be linear and even constant.

In accordance with a preferred embodiment of the present invention, the operands of a specific vector-matrix computation may be stored in cells connected to the same bit-line, i.e. in one column, as described hereinbelow, such that concurrently activating several rows may provide a result of a vector-matrix multiplication, which result may further be written back to memory array 310.

Figure 4:
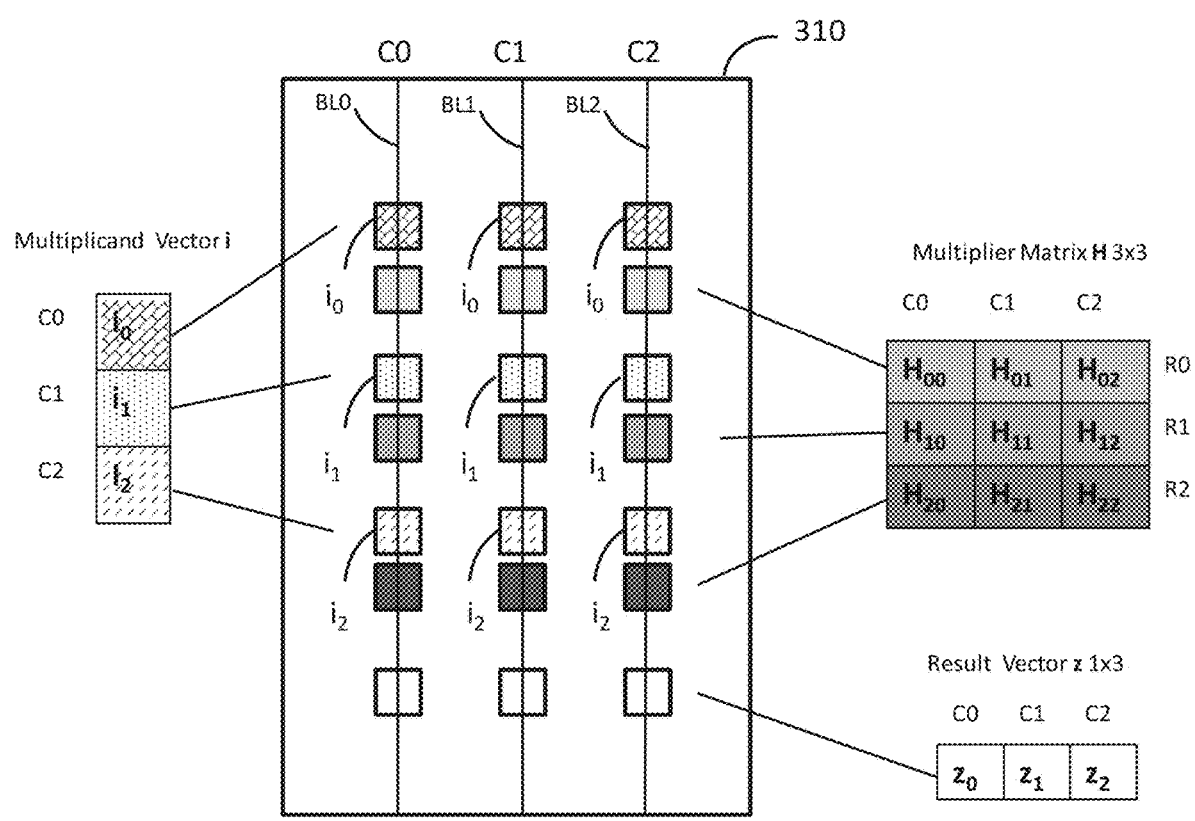
FIG. 4 is a schematic illustration of a memory arrangement of operands of a vector-matrix multiplication, in accordance with a preferred embodiment of the present invention, useful in understanding the operation of the device of FIG. 3.

Reference is now made to FIG. 4, which illustrates a memory arrangement of operands from multiplicand vector i, and operands from multiplier matrix H in memory array 310. In accordance with a preferred embodiment of the present invention, vector i is stored as a column (rather than as a row) in each and every column of memory array 310, which is used to store matrix H, such that bit $i_0$ of vector i is repeatedly stored in columns C0, C1 and C2 of a row of memory array 310, bit $i_1$ is repeatedly stored in a second row and bit $i_2$ is repeatedly stored in a third row. It may be appreciated that the operands from vector i and the operands from matrix H used in each computation are all stored in the same column, connected to a same bit-lines: BL0 in columns C0, BL1 in column C1 and BL2 in C2. Additional rows, used for intermediate storage and final results, may also be used, as further described hereinbelow. It may be appreciated that a single operand from vector i is stored in several locations to optimize the computation at the expense of some extra storage.

Figure 2:
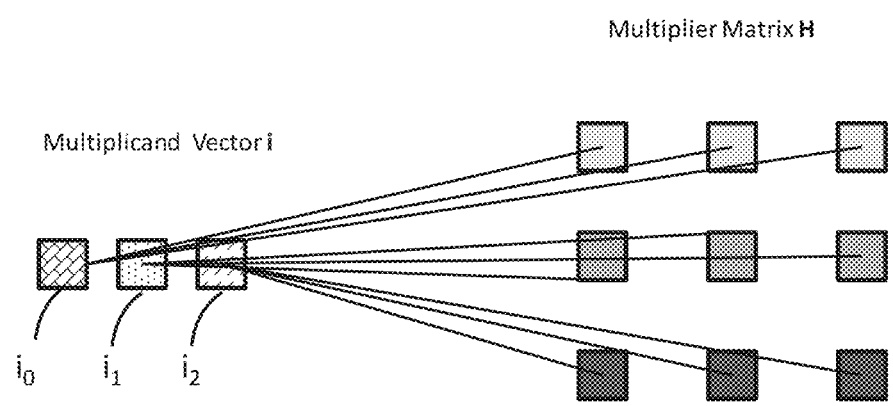
FIG. 2 is a schematic visual representation of the multiplication operation during a vector-matrix multiplication.

Since each data item from the vector is replicated over an entire row of the array, the number of needed connections between all operands of a computation may be reduced, as can be seen in FIG. 4. It may be appreciated that the number of connections is dramatically reduced from those in FIG. 2 by an order of magnitude, from m2 to m (where m is 3 in the example).

It may be appreciated that, as can be seen in FIG. 4, the bits $i_j$ from vector i may be placed right above the bits $H_{ij}$ from matrix H, providing a close vicinity between operands.

It may be appreciated that the number of rows and columns in memory array 310 may be larger than the number of rows and columns of matrix H. For simplicity, the description uses the same row[s] and column[s] identifiers to identify a row/column from matrix H and a row/column in memory array 310. However, any other placement of rows and columns from matrix H in memory array 310 is possible as long as the order of rows and columns in the array remains identical to the order in the matrix, the relevant items from vector i and from matrix H are stored on a same column, and the computation result may be associated to a relevant location in the result vector.

FIG. 5, to which reference is now made, illustrates the placement of the different participants in the vector matrix multiplication process. Cells in one section, such as section 315 of memory array 310 (of FIG. 3), are illustrated.

Section 315 may comprise n columns C0, C1 ... Cn, and a plurality of rows, each row storing values from different sources. The source of a value stored in a row may be vector i, matrix H, a multiplication operation sum operation and any temporary computation needed to achieve a sum or a product computation.

Section 315 may have the following row types: R-vector-bit rows, repeatedly storing the value of a specific bit j of vector i in all the cells of the row; R-matrix-row rows, storing an entire row j of matrix H; R-product rows; each storing the product of the vector bits and matrix bits of associated rows; and an R-sum row that may store the sum of all associated products. It may be appreciated that the products and sum may be calculated according to equation 1.

Figure 6A:
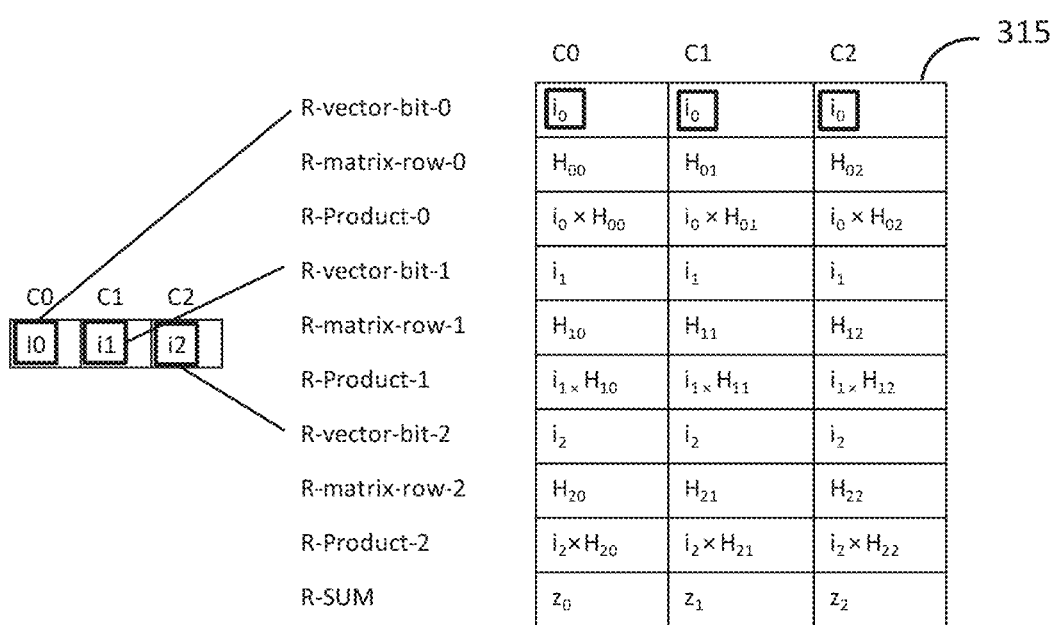

FIGS. 6A, 6B, 6C and 6D, to which reference is now made, illustrate in more detail the value of cells in section 315 according to an embodiment of the present invention. FIG. 6A illustrates the process of storing values in R-vector-bit rows. Row R-vector-bit-O may store the value of bit i0 of vector i in all the columns (C0, C1 and C2); row R-vector-bit-1 may store the value of bit i1 of vector i in all the columns and similarly, row R-vector-bit-2 may repeatedly store the value of bit i2 of vector i in all the cells of the row.

Figure 6B:
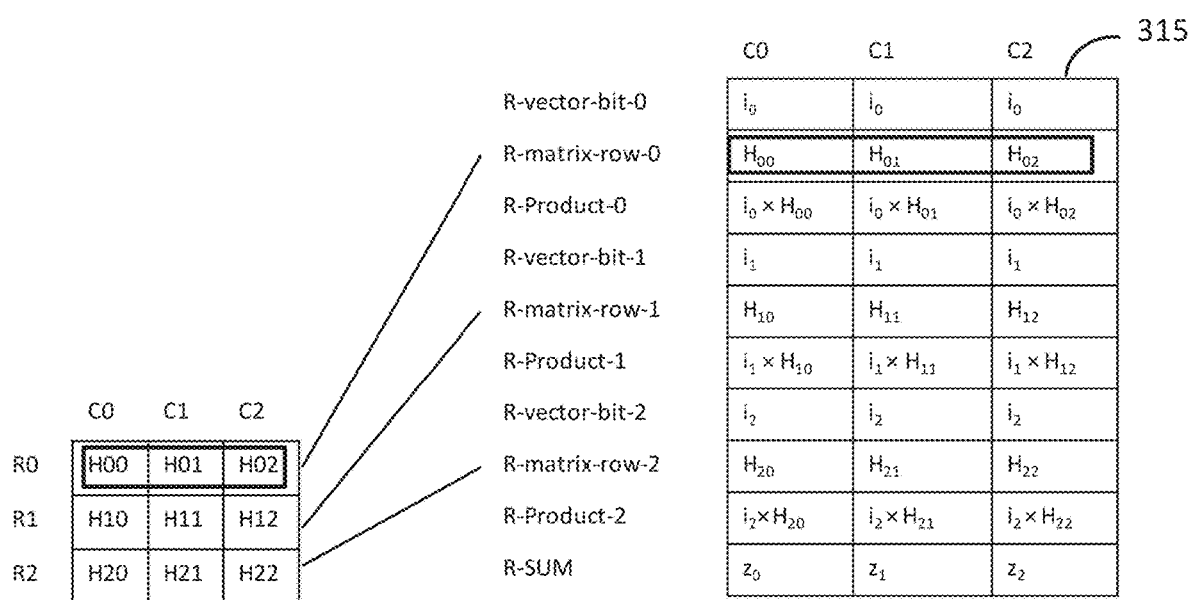

FIG. 6B illustrates the process of storing values in R-matrix rows. Row R-matrix-row-0 of section 315 may store the value of row R0 of matrix H; row R-matrix-row-1 in section 315 may store the value of row R1 of matrix H and similarly row R-matrix-row-2 in section 315 may store the value of row R2 of matrix H.

Figure 6C:
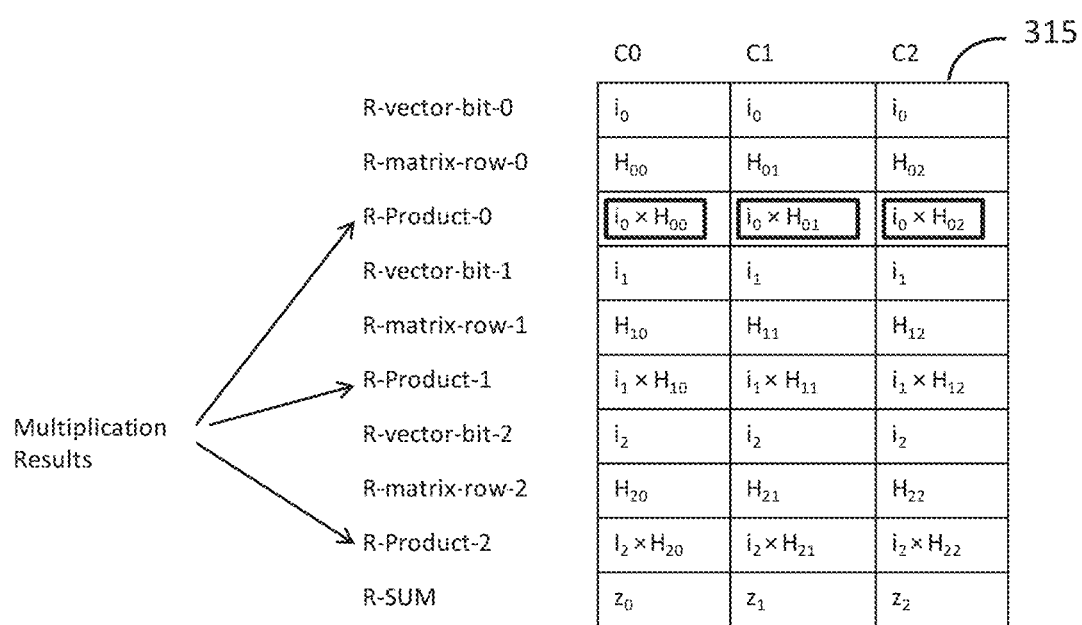

FIG. 6C illustrates the content that may be stored in rows R-product. Each R-product-j row of section 315 may store a result of a multiplication operation between cells in R-vector-bit-j (bit j from vector i) and cells in R-matrix-row-j (row j from matrix H) of the same column, for all columns at once. Row R-product-O may store the multiplication result of cells in R-vector-bit-0 and cells in R-matrix-row-O: i0×H00, i0×H01, i0×H02; Row R-product-1 may store the multiplication result of cells in R-vector-bit-1 and cells in R-matrix-row-1: i1×H10, i1×H11, i1×H12; and Row R-product-2 may store the multiplication result of cells in R-vector-bit-2 and cells in R-matrix-row-2: i2×H20, i2×H21, i2×H22. As both cells are connected to the same bit-line, the bit-line may have a result of a Boolean operation performed on those two cells. Since, as discussed hereinbelow, the result is not yet the multiplication result, Selective Write Unit 340 (of FIG. 3) may write the Boolean result to a temporary location to be used during the calculation of the product.

Repeating this procedure of activating two rows and writing a Boolean result to a third row of the same column may, by selecting the correct rows each time, as discussed in U.S. Pat. No. 8,238,173 to Akerib et al., result in a product between a vector multiplicand bit and a matrix multiplier bit, for all columns. A similar operation may provide a sum of all the multiplication results, which may be stored in row R-sum (FIG. 6D), i.e. it may store the sum of R-product-0+R-product-1+R-product-2 of a column.

It may be appreciated that the computation, performed on all columns of the array concurrently, may include two steps: multiplication in parallel and sum in parallel of all multiplication results.

The multiplication operation may be performed for each pair of rows R-vector-bit-j×R-matrix-row-j by the following steps: controller 350 (of FIG. 3) may instruct multiple row decoder 320 to concurrently activate a pair of rows. Row decoder 320 may activate the pair of rows as instructed. The bit-lines of each column may hold the results of a Boolean operation between values stored in activated cells in a column: $i_j \times H_{jk}$.

It will be appreciated that, when all columns are concurrently activated, the multiplication of one of the vector bits by all of the relevant matrix elements (i.e. $i_j * H_{jk}$) may be calculated simultaneously. Thus, the number of steps needed to perform the multiplications of the entire matrix H is just the number of rows in the multiplying matrix, 3 in the example. Similarly, when all columns are concurrently activated, the sum of all columns may be calculated simultaneously, i.e. the entire output vector z may be calculated concurrently in a single step. Thus, the complexity of a vector-matrix multiplication using this memory configuration, may be linear, i.e. O(n).

It may be appreciated that R-vector-bit rows (sourced from vector i) and R-matrix-row rows (sourced from matrix H) may be located remotely in memory and do not have to be located as consecutive rows. They must, however, provide a connectivity via a single bit-line between operands of a computation. FIG. 7, to which reference is now made, illustrates an alternative embodiment for row assignments in memory array 310 in a single section. In FIG. 7, the elements of each type are stored in consecutive rows: all the vector related rows are stored in consequent rows in section 315, all matrix related rows are stored in consequent rows in section 315 and all computation rows are stored in consequent rows in section 315. As long as the operand of each computation is stored on cells of a same column, connected by the same bit-line, the multiplication and summation may be performed in place, concurrently on all columns.

Figure 8:
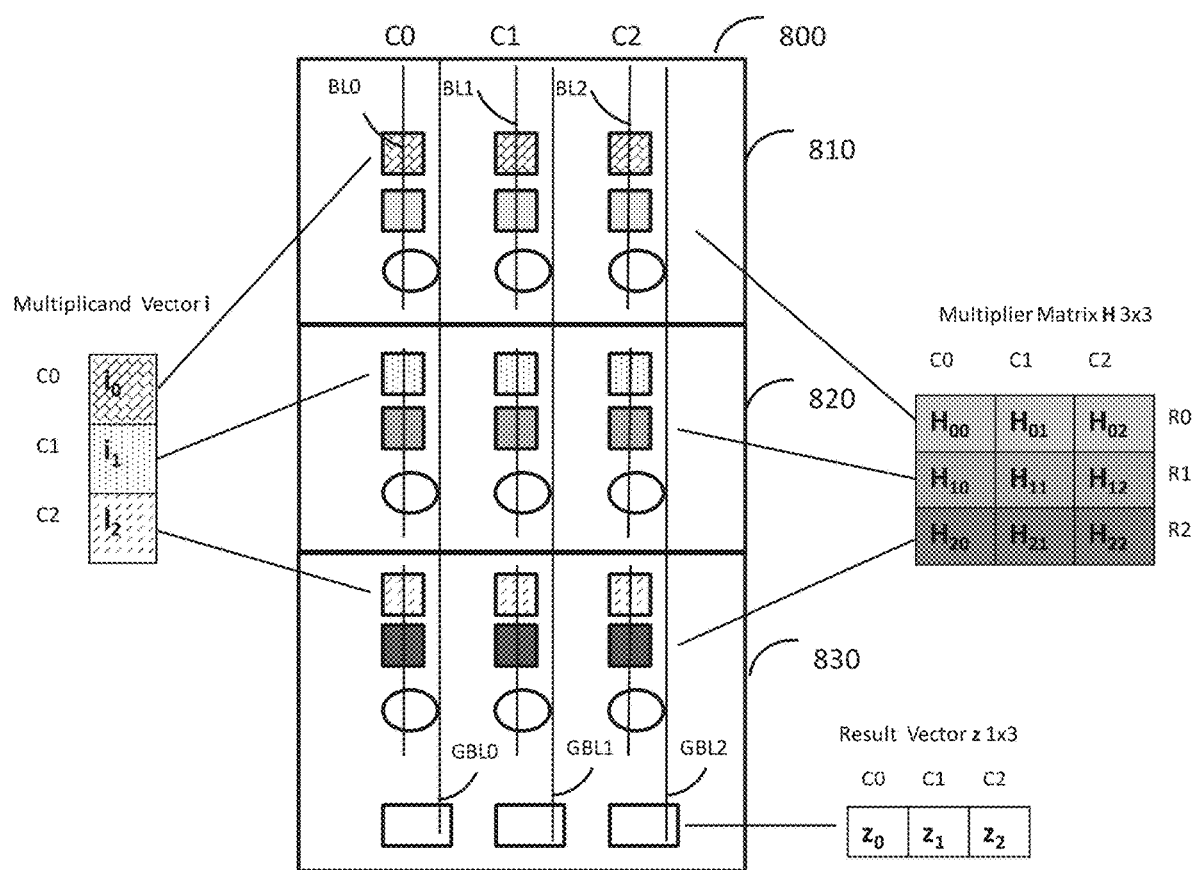
FIG. 8 is a schematic illustration of row assignment in a multi segment associative memory array, constructed and operative in accordance with a preferred embodiment of the present invention.

FIG. 8, to which reference is now made, illustrates an alternative preferred embodiment of the present invention. In this embodiment, memory array 800 may comprise several sections 810, 820 and 830 where each pair of associated rows, the row storing the multiplicand bit from vector i and the row storing the multiplier row from matrix H, may be stored in one of the available sections. Memory array 800 may comprise local bit lines BLi within sections and global bit lines GBLk which connect local bit lines of different sections. Using this configuration, storing each pair of rows in a dedicated section, it may be possible to activate all rows concurrently, providing the multiplication results of the entire vector-matrix multiplication in a single step, a result in each section, instead of activating a pair of rows at a time. In the summing step, cells connected with a global bit-line may be activated to provide the sum of all products. Using a dedicated section to each pair of rows may provide all the multiplication results in a single step and an additional step for the sum calculation, providing a complexity of O(1) to the entire vector-matrix multiplication process.

As described hereinabove, storing all rows in a single section may provide a complexity of O(n), and any combination of the number of sections and the row arrangement inside the sections may provide a complexity between O(1) and O(n). In each case, the number of available sections and the size of the matrix may be taken into consideration when arranging the vector and matrix information in the memory array.

Figure 9:
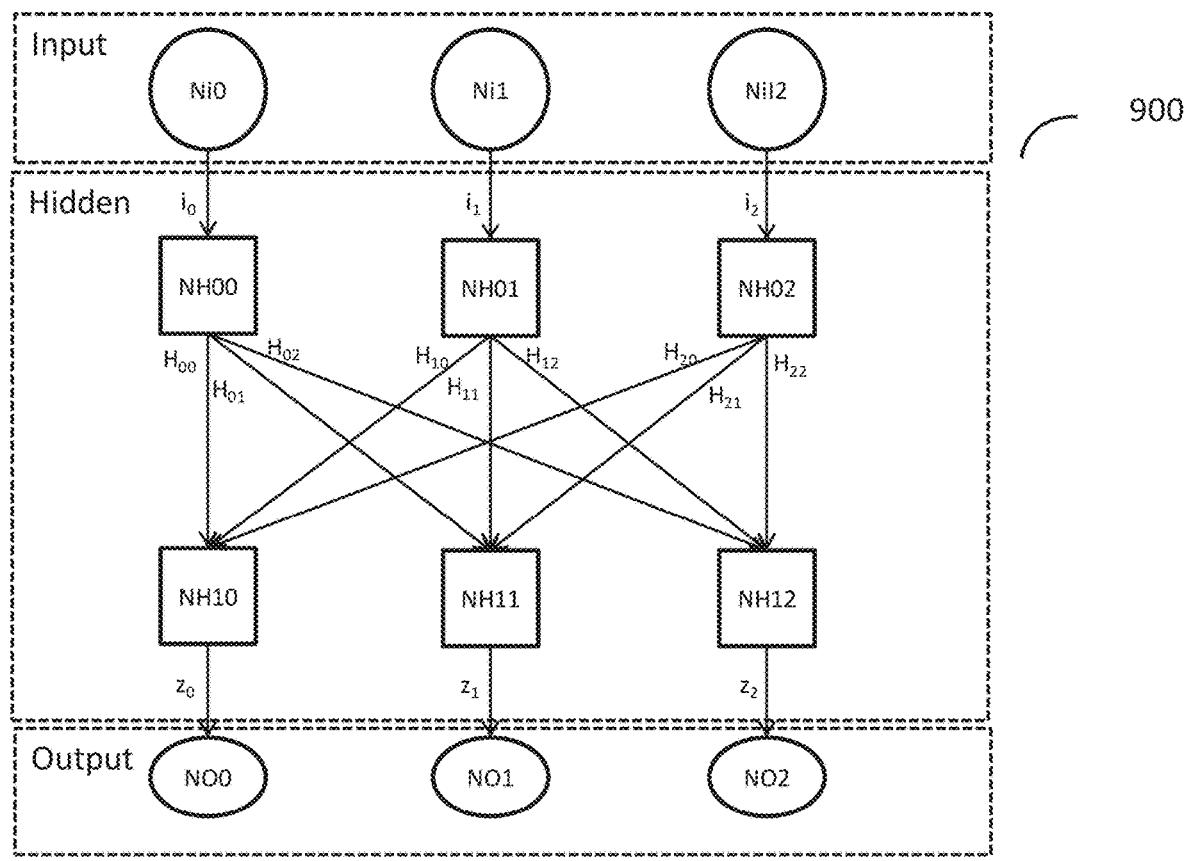
FIG. 9 is a schematic illustration of an artificial neural network computation in an associative memory array, constructed and operative in accordance with a preferred embodiment of the present invention.

Improving the complexity of a vector-matrix multiplication may significantly improve the computation complexity of artificial neural networks. In artificial neural networks, multiple nodes, representing the cells of the brain, are connected by weighted links, representing the connectivity strength in the synapses between the cells. FIG. 9, to which reference is now made, illustrates an exemplary artificial neural network. The nodes of an artificial neural network are arranged in layers: an input layer includes the input values of the problem in question (circles in the drawing), a group of hidden layers (rectangles in the drawing) connected by weighted links (arrows in the drawing), and an output layer (ellipses in the drawing) that may provide an answer to the question in mind.

FIG. 9 illustrates the usage of vectors and matrices in such an artificial neural network. The neural network comprises input nodes Ni0-Ni2, hidden layers nodes NH00-NH12 and an output layer N00-N02. This neural network. may be calculated using the vector-matrix calculation of the example of FIGS. 6A-6D, using a mapping. The weights i0, i1, i2 between the nodes of the input layer Ni0, Ni1 Ni2 and the first layer of the hidden layer NH00, NH01 NH02 may be mapped to vector i. The weights H00, H01, H02, H10, H11, H12, H20, H21, H22 between the first layer of the hidden layers NH00, NH01, NH02 and the second layer of the hidden layer NH10, NH11 NH22, may be mapped to matrix H. The weights z0, z1 z2 between the hidden layers and the output layer: NO0, NO1 NO2, may be mapped to vector z.

In accordance with a preferred embodiment of the present invention, the data of the neural network may be arranged in the associative memory array in a manner similar to the vector matrix multiplication described hereinabove, such that the operands of a processing step are located on the same column (i.e. on the same bit-line). In this manner the multiplier and the multiplicand may be simultaneously activated to provide the result of the multiplication on a result row, and simultaneously activating a plurality of result rows may provide the sum, with the advantage of performing the entire computation in memory without having to perform any input-output (TO) operation of the data used for computation. The only needed IO is receiving an input vector i and providing and output vector z.

The matrix (the hidden layers of the neural network) may be stored once in memory array 310 (of FIG. 3) and may be used multiple times, for different input vectors, providing an output vector for each. Since the matrix is stored once, when the network is trained and ready to operate, the complexity of the matrix insertion to memory array 310 has no impact on the computation complexity of the on-going activity of the neural network.

A typical on-going usage of a neural network may be receiving and storing an input vector, performing the computation and receiving [a] an output. It may be appreciated that storing the input vector into memory array is a repeated task whose complexity may have an impact on the overall complexity of the neural network since a new input vector is provided for each computation. It may be appreciated that the entire vector may be written to memory array 310, in the arrangement described hereinabove, at once. All cells storing a bit from the input vector (in each relevant column and each relevant row) may be set to the appropriate value in a single step, using the multi-cell write operation defined in U.S. Pat. No. 9,558,812 to Akerib et al.

Figure 10:
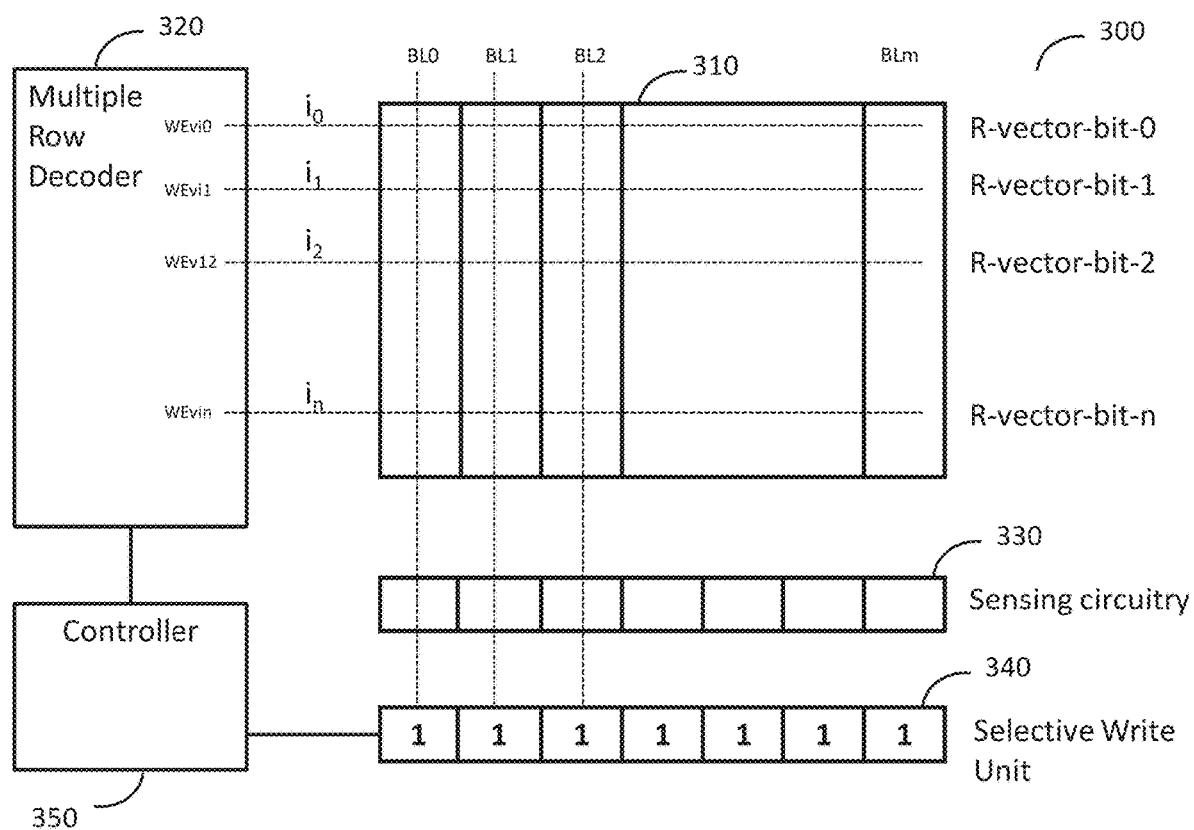
FIG. 10 is a schematic illustration of a constant complexity procedure for storing a vector in an associative memory array constructed and operative in accordance with a preferred embodiment of the present invention.

FIG. 10, to which reference is now made, illustrates how vector i may be stored in memory array 310 in a constant complexity regardless of the size of the vector.

First, the cells of each row R-vector-bit-j must be cleared to ensure that previous content is erased. Using the multi-cell write operation, the value "0" may be concurrently written to all cells of all rows R-vector-bit-j. Controller 350 may instruct multiple row decoder 320 to set the value "0" on write enable (WE) lines WEvi0, WEvi1, WEvi2 . . . WEvin (the WE of all R-vector-bit rows). Controller 350 may activate all columns in selective write unit 340 which may set the value "0" to all selected cells.

After clearing all cells in R-vector-bit rows, controller 350 may set the values of the bits of vector i to the WE lines. Using the multi-cell write operation, controller 350 may set the value of i0 to WEvi0, it to WEvi1 i2 to WEvi2, etc. until the last bit from vector i is set to WEvin. Controller 350 may instruct selective write unit 340 to activate all columns which may result by setting the value of i0 to all cells of row R-vector-bit-0, the value it to all cells of row R-vector-bit-1 and so on to all R-vector bit rows until R-vector-bit-n.

It may be appreciated that the entire distribution of all bits from vector i to all bits of all rows R-vector-bit may typically take 2 clock cycles: one to clear any previous content from cells storing vector related operands in memory array 310 and the other to distribute all bit values 1 from vector i to the relevant operand cells.

The concurrent bit distribution has a complexity of O(1) since it does not depend on the number of columns of array 310.

It may be appreciated that all multiplication steps may be performed in parallel, i.e. all $A_k B_{kj}$ may be done in a single step in the best case and in n steps in the worst case, depending on the number of sections in memory array 310. It may further be appreciated the all the sum operations $$\sum_{k=1}^{m}(A_{ik}B_{kj})$$

may also be done in a single step.

It may be further appreciated that there are no crossing interconnections between operands, as in the prior art, and all outputs are generated at the same time because the input data is repeated in several locations, replacing the cross interconnections with 'data repeats'. Input vector i is stored in a vertical manner together with each row j of matrix H in a column of memory array 310.

In addition to the low computation complexity, it may be appreciated that it may be easy to provide linear scaling to the network. Increasing the output vector (i.e. adding output nodes to the neural network) may be implemented by adding columns to the memory array, and increasing the input vector (i.e. adding more input nodes) may be achieved by adding rows (each input row may store an additional input value) as is illustrated in FIG. 11 to which reference is now made.

Figure 11:
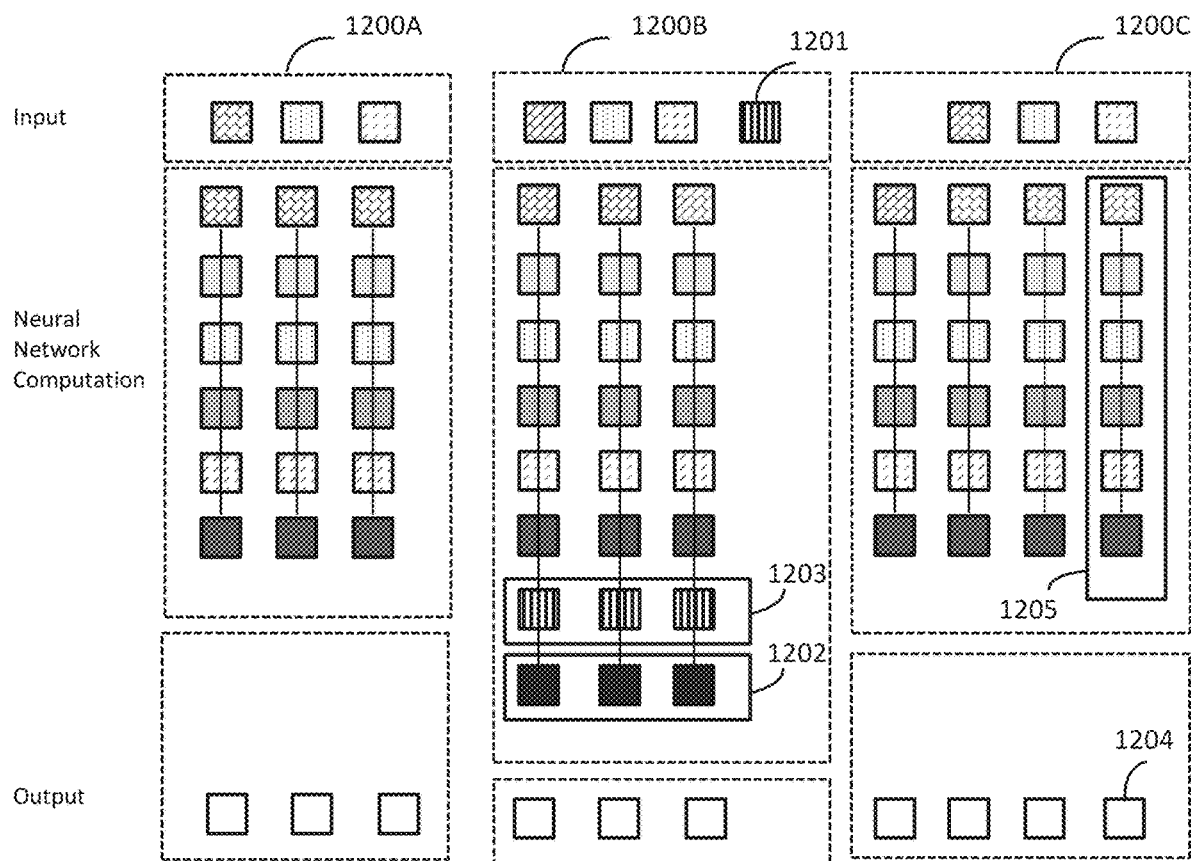
FIG. 11 is a schematic illustration of neural network scaling capabilities using an associative memory array, constructed and operative in accordance with a preferred embodiment of the present invention.

FIG. 11 schematically illustrates the outcome of adding an input node or an output node to an existing neural network, constructed and operative in accordance with a preferred embodiment of the present invention. Item 1200A is an exemplary memory configuration of a neural network with a 1×3 input vector, a 3×3 matrix and a 1×3 output vector, capable of computing the neural network of FIG. 9.

Item 1200B is an exemplary network configuration where an additional value 1201 is added to the input vector increasing the size of the input vector to 1×4. This change may be reflected in the network by adding an additional row to the matrix (as the number of rows of a multiplier matrix must be equal to the number of columns of the multiplicand vector). The new row of the matrix may be reflected in the memory array by a new row 1202 storing the new matrix line and an additional new row 1203 storing the value of the added bit repeatedly in all row cells.

Item 1200C is an exemplary network configuration where an additional value 1204 is added to the output vector increasing the size of the output vector to 1×4. Adding a new output value may be reflected in the network by adding an additional column to the matrix, as the number of column of the matrix must be equal to the number of columns of the product vector). The new column in the matrix is reflected in memory by a new column 1205 in the memory array.

It may be appreciated that a single neural network may also be implemented by a distributed system comprised of several associative memory devices 300 of FIG. 3. Each memory device 300 may compute the entire computation related to a single output node of a neural network. In such a distributed configuration, scalability is also easily achieved. Increasing the output vector (i.e. adding output nodes to the neural network) may be implemented by adding an associative memory devices 300, while increasing the input vector (i.e. adding more input nodes) may be achieved by adding rows (each input row may store an additional the input value) to each memory device 300 of the distributed system.

As already mentioned hereinabove, matrix-matrix multiplication may be regarded as multiple vector-matrix multiplications (the number of rows of the multiplicand vector is the number of needed vector-matrix multiplications). The multiplier matrix may be stored as described hereinabove while each vector (i.e. row of the multiplicand matrix) may be stored in memory as described hereinabove. The multiplication process is performed one row of the multiplicand at a time by selecting, for each multiplicand row, the associated pair of rows.

Unless specifically stated otherwise, as apparent from the preceding discussions, it is appreciated that, throughout the specification, discussions utilizing terms such as "processing," "computing," "calculating," "determining," or the like, refer to the action and/or processes of a general purpose computer of any type such as a client/server system, mobile computing devices, smart appliances or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. The resultant apparatus when instructed by software may turn the general purpose computer into inventive elements as discussed herein. The instructions may define the inventive device in operation with the computer platform for which it is desired. Such a computer program may be stored in a computer readable storage medium, such as, but not limited to, any type of disk, including optical disks, magnetic-optical disks, read-only memories (ROMs), volatile and non-volatile memories, random access memories (RAMs), electrically programmable read-only memories (EPROMs), electrically erasable and programmable read only memories (EEPROMs), magnetic or optical cards, Flash memory, disk-on-key or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description herein. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for in memory vector-matrix multiplication, the method comprising:

having a multiplier matrix stored in a memory array having at least two sections, wherein each of said at least two sections is one of: a volatile memory array, a non-volatile memory array, a destructive memory array and a non-destructive memory array;

receiving an input multiplicand arranged in a vector and storing it in said memory array such that the operands of said vector-matrix multiplication are located on a same column of said memory array; and in-memory, computing said vector-matrix multiplication using said stored input vector and said stored multiplier matrix.

2. A device for in memory vector-matrix multiplication, the device comprising:

a memory array having at least two sections, said memory array storing a multiplier matrix, said memory array also to receive and store an input multiplicand arranged in a vector such that the operands of said vector-matrix multiplication are located on a same column of said memory array, wherein each of said at least two sections is one of: a volatile memory array, a non-volatile memory array, a destructive memory array and a non-destructive memory array; and in-memory logic for computing an output of said vector-matrix multiplication using said stored input vector and said stored multiplier matrix.

3. The device according to claim 2 and wherein said memory array is one of the following type of memory array: RAM, DRAM, SRAM, Re-RAM, ZRAM, MRAM and Memristor.

4. The device according to claim 2 and wherein said multiplier matrix comprises weights of a neural network and wherein said input multiplicand is an input of said neural network.

* * * * *